United States Patent
Wang et al.

(10) Patent No.: US 10,862,470 B2
(45) Date of Patent: Dec. 8, 2020

(54) COMPARATOR CIRCUITRY

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ting-Hao Wang, Hsinchu (TW); Hao-Che Hsu, Hsinchu (TW); Pei-Ju Lin, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/275,344

(22) Filed: Feb. 14, 2019

(65) Prior Publication Data
US 2020/0091903 A1    Mar. 19, 2020

(30) Foreign Application Priority Data
Sep. 17, 2018    (TW) .............................. 107132667 A

(51) Int. Cl.
*H03K 5/24*    (2006.01)

(52) U.S. Cl.
CPC ......... *H03K 5/2481* (2013.01); *H03K 5/2472* (2013.01)

(58) Field of Classification Search
CPC ....... H03K 5/2481; H03K 5/2472; H03K 5/24
See application file for complete search history.

(56) References Cited

U.S. PATENT DOCUMENTS

| | | | |
|---|---|---|---|
| 7,683,714 B2 * | 3/2010 | Nishimura | H03F 3/3022 330/253 |
| 7,956,686 B2 * | 6/2011 | Yuasa | H03F 3/45219 330/253 |
| 8,228,094 B2 | 7/2012 | Kuttner | |

FOREIGN PATENT DOCUMENTS

CN    101841335 B    3/2015

* cited by examiner

*Primary Examiner* — Jung Kim
(74) *Attorney, Agent, or Firm* — CKC & Partners Co., LLC

(57) ABSTRACT

A comparator circuitry includes an input pair circuit, a load circuit, and a compensation circuit. The input pair circuit is configured to compare a first input signal with a second input signal, in order to control a first bias current. The load circuit is coupled to the input pair circuit, and is configured to output an output signal having a first level from a first output terminal of the load circuit in response to the first bias current. The compensation circuit is coupled to the input pair circuit and the load circuit, and is configured to drain a compensation current from the first output terminal to a voltage source during the load circuit generates the output signal having a first level, in which the voltage source is configured to provide a voltage having a second level.

4 Claims, 5 Drawing Sheets

COMPARATOR CIRCUITRY

RELATED APPLICATIONS

This application claims priority to Taiwan Application Serial Number 107132667, filed Sep. 17, 2018, which is herein incorporated by reference.

BACKGROUND

Technical Field

The present disclosure relates to a comparator circuitry. More particularly, the present disclosure relates to a comparator circuitry adapted to high-speed applications.

Description of Related Art

Comparators have been widely used in various electronic devices, in order to provide a control function of comparing or determining a predetermined condition. The accuracy of the comparator, which includes, for example, operating timings, the quality of the output signal, etc, affect the operations of remaining circuits in the system. For example, if the comparator is applied to high-speed applications, the comparator may be affected by timing jitters, and thus the quality of the signal is reduced.

SUMMARY

Some aspects of the present disclosure are to provide a comparator circuitry that includes an input pair circuit, a load circuit, and a compensation circuit. The input pair circuit is configured to compare a first input signal with a second input signal, in order to control a first bias current. The load circuit is coupled to the input pair circuit, and is configured to output an output signal having a first level from a first output terminal of the load circuit in response to the first bias current. The compensation circuit is coupled to the input pair circuit and the load circuit, and is configured to drain a compensation current from the first output terminal to a voltage source during a period that the load circuit generates the output signal having a first level, in which the voltage source is configured to provide a voltage having a second level.

Some aspects of the present disclosure are to provide a comparator circuitry that includes a current source circuit, an input pair circuit, a load circuit, and a cross-coupled transistor pair. The current source circuit is configured to provide a bias current. The input pair circuit is coupled to the current source circuit, the input pair circuit configured to compare a first input signal with a second input signal, in order to steer the bias current. The load circuit is coupled to the current source circuit, and is configured to generate a first output signal at a first output terminal and generate a second output at a second output terminal according to the steered bias current. The cross-coupled transistor pair includes a first transistor and a second transistor. The first transistor is coupled between the first output terminal and the current source circuit, and is configured to be turned on according to the first input signal, in order to drain a first compensation current from the first output terminal. The second transistor is coupled between the second output terminal and the current source circuit, and is configured to be turned on according to the second input signal, in order to drain a second compensation current from the second output terminal.

Some aspects of the present disclosure are to provide a comparator circuitry that includes an input pair circuit, a load circuit, a first transistor, and a second transistor. The input pair circuit is coupled to a first current source circuit, and is configured to compare a first input signal with a second input signal, in order to steer a first bias current generated from the first current source circuit. The load circuit is configured to generate a first output signal at a first output terminal and generate a second output at a second output terminal according to the steered first bias current. The first transistor is coupled between the first output terminal and a second current source circuit, and is configured to be constantly turned on according to a bias signal, in order to drain a first compensation current from the first output terminal. The second transistor is coupled between the second output terminal and second current source circuit, and is configured to be constantly turned on according to the bias signal, in order to drain a second compensation current from the second output terminal, wherein a sum of the first compensation current and the second compensation current is substantially the same as a second bias current provided from the second current source circuit.

As described above, the comparator circuitry in embodiments of the present disclosure is able to improve the quality of the output signal by the compensation current, in order to be adapted to high-speed applications.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
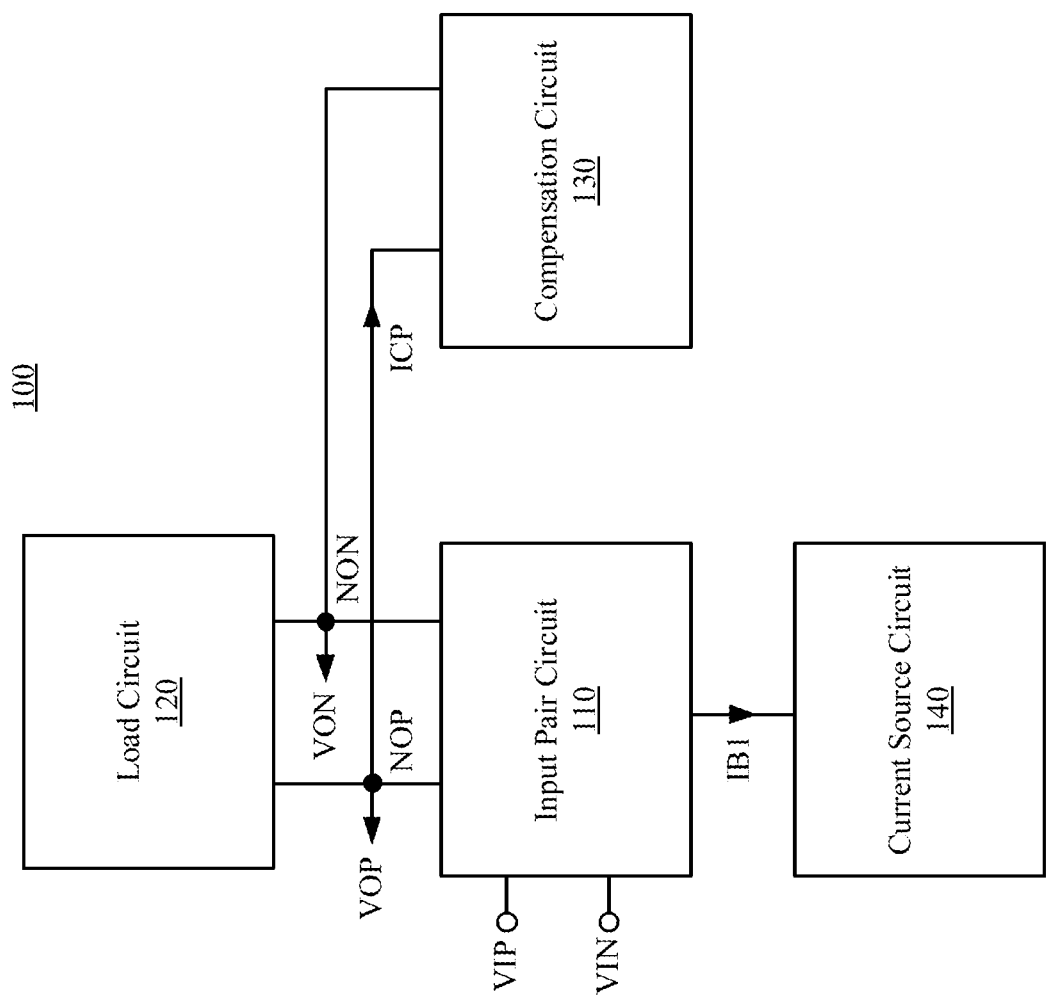
FIG. 1 is a schematic diagram of a comparator circuitry according to some embodiments of the present disclosure.

Reference is made to FIG. 1. FIG. 1 is a schematic diagram of a comparator circuitry 100 according to some embodiments of the present disclosure. In some embodiments, the comparator circuitry 100 may be applied to various data transmission systems. In some embodiments, the comparator circuitry 100 includes an input pair circuit 110, a load circuit 120, a compensation circuit 130, and a current source circuit 140.

The input pair circuit 110 is coupled between the load circuit 120 and the current source circuit 140. In some embodiments, the input pair circuit 110 is configured to compare an input signal VIP with an input signal VIN, in order to control a bias current IB1 generated from the current source circuit 140. For example, the input pair circuit 110 may be implemented with a fully differential input pair (e.g., transistors described below). Under this condition, in response to the input signal VIP being greater than the input signal VIN, a majority of the bias current IB1 is steered to a signal path for processing the input signal VIP in the input pair circuit 110. Alternatively, in response to the input signal VIP being less than the input signal VIN, the majority of the bias current IB1 is steered to a signal path for processing the input signal VIN in the input pair circuit 110. In some embodiments, one of the input signal VIP or the input signal VIN may be a reference signal for comparison. In some embodiments, the current source circuit 140 may include a current mirror circuit implemented with one or more transistors, but the present disclosure is not limited thereto.

The load circuit 120 is configured to provide at least one active load, in order to generate, in response to the current IB1 steered by the input pair circuit 110, an output signal VOP at an output terminal NOP thereof and an output signal VON at an output terminal NON thereof. For example, if the input signal VIP is greater than the input signal VIN, the output signal VOP having a high level (e.g., voltage VDD) is output from the output terminal NOP, and the output signal VON having a low level (e.g., ground voltage) is output from the output terminal NON. Alternatively, if the input signal VIP is less than the input signal VIN, the output signal VOP having a low level is output from the output terminal NOP, and the output signal VON having a high level is output from the output terminal NON.

The compensation circuit 130 is configured to drain a compensation current ICP from the output terminal NOP and transmit the same to a voltage source that provides a predetermined level (e.g., the low level discussed above and/or voltage VSS shown in FIGS. 2-3 below) during a time interval when the load circuit 120 outputs the output signal VOP having a specific level (i.e., the high level discussed above). In some embodiments, during a period that the input pair circuit 110 compares the input signal VIN with the input signal VIP, the compensation current ICP is drained from a signal path that the less bias current IB1 flows through in the input pair circuit 110 and/or the load circuit 120.

In some approaches, a comparator is employed to directly perform the comparison without employing the compensation circuit 130. In these approaches, the quality of an output signal from the comparator is dependent from a switching frequency of an input signal. In high-speed data transmission, the input signal has higher switching frequency, and thus a subsequent comparison is caused to be performed before the output of the comparator reaches to a steady state. As a result, the quality of the output signal of the comparator is reduced. Compared with the above approaches, by draining the compensation current ICP, the output of comparator circuitry 100 is able to reach the steady state rapidly. As a result, the comparator circuitry 100 is able to be applied to the high-speed data transmission. Detailed operations regarding this matter are given in paragraphs below with reference to FIG. 4 and FIG. 5.

The following paragraphs provide embodiments or implementations about the circuitries discussed above, but the present disclosure are not limited thereto.

Figure 2:
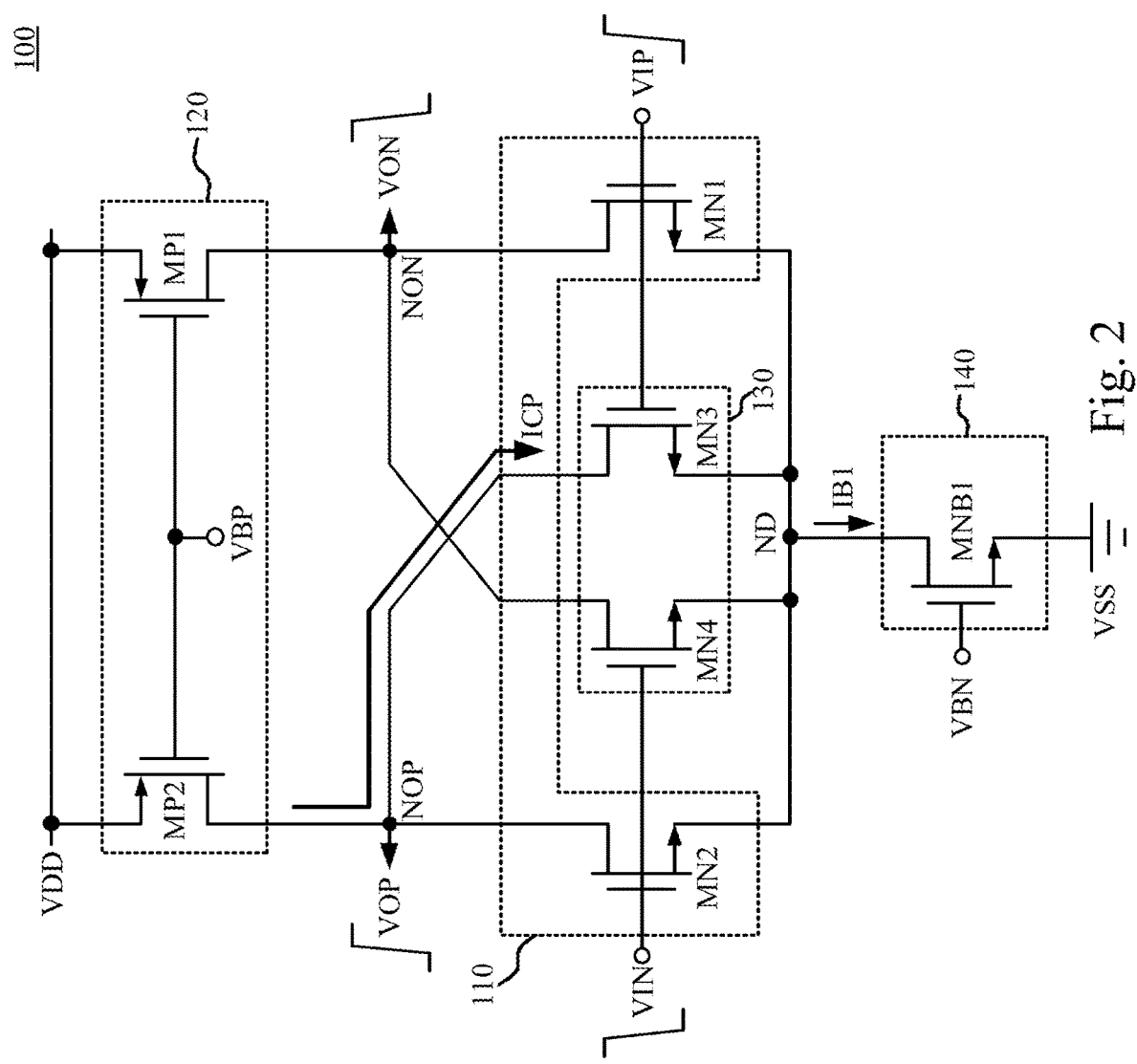
FIG. 2 is a circuit diagram of the comparator circuitry in FIG. 1, according to some embodiments of the present disclosure.

Reference is now made to FIG. 2. FIG. 2 is a circuit diagram of the comparator circuitry 100 in FIG. 1, according to some embodiments of the present disclosure. For ease of understanding, like elements in FIG. 2 are designated with the same reference numbers with respect to FIG. 1.

As shown in FIG. 2, input pair circuit 110 includes a transistor MN1 and a transistor MN2. In some embodiments, the transistor MN1 and the transistor MN2 are configured as a differential input pair. A first terminal of the transistor MN1 is coupled to the output terminal NON of the load circuit 120, a second terminal of the transistor MN1 and the current source circuit 140 are coupled to a node ND, and a control terminal of the transistor MN1 is configured to receive the input signal VIP. A first terminal of the transistor MN2 is coupled to the output terminal NOP of the load circuit 120, a second terminal of the transistor MN2 and the current source circuit 140 are coupled to the node ND, and a control terminal of the transistor MN2 is configured to receive the input signal VIN. In this example, the current source circuit 140 includes a transistor MNB1. A first terminal of the transistor MNB1 is coupled to the node ND, a second terminal of the transistor MNB1 is coupled to a voltage source for providing the voltage VSS, and a control terminal of the transistor MNB1 is configured to receive a bias signal VBN. The transistor MNB1 generates the bias current IB1 according to the bias signal VBN. In some embodiments, the voltage VSS is lower than the voltage VDD, in which the voltage VSS may be a ground voltage, but the present disclosure is not limited thereto.

As shown in FIG. 2, the load circuit 120 includes a transistor MP1 and a transistor MP2. First terminals of the transistor MP1 and the transistor MP2 are coupled to a voltage source to receive the voltage VDD. Control terminals of the transistor MP1 and the transistor MP2 are configured to receive a bias signal VBP, in order to provide an active load to the input pair circuit 110 respectively. The transistor MP1 or the transistor MP2 generates the output signals VON and VOP according to the provided active load and the bias current IB1 steered by the input pair circuit 110 and the current source. A second terminal of the transistor MP1 is coupled to the output terminal NON, and a second terminal of the transistor MP2 is coupled to the output terminal NOP.

As shown in FIG. 2, when the input signal VIP transits from a low level to a high level and the input signal VIN transits from the high level to the low level, the transistor MN1 is turned on and the transistor MN2 is turned off. Under this condition, most of the bias current IB1 is steered to flow through a signal path of the transistor MP1 and the transistor MN1. As a result, the load circuit 120 outputs the output signal VON having a low level, and outputs the output signal VOP having a high level.

As shown in FIG. 2, the compensation circuit 130 includes a transistor MN3 and a transistor MN4. In some embodiments, the transistor MN3 and the transistor MN4 are configured as a cross-coupled transistor pair. A first terminal of the transistor MN3 is coupled to the output terminal NOP, a second terminal of the transistor MN3 is coupled to the node ND, and a control terminal of the transistor MN3 is configured to receive the input signal VIP. A first terminal of the transistor MN4 is coupled to the output terminal NON, a second terminal of the transistor MN4 is coupled to the node ND, and a control terminal of the transistor MN4 is configured to receive the input signal VIN.

Figure 5:
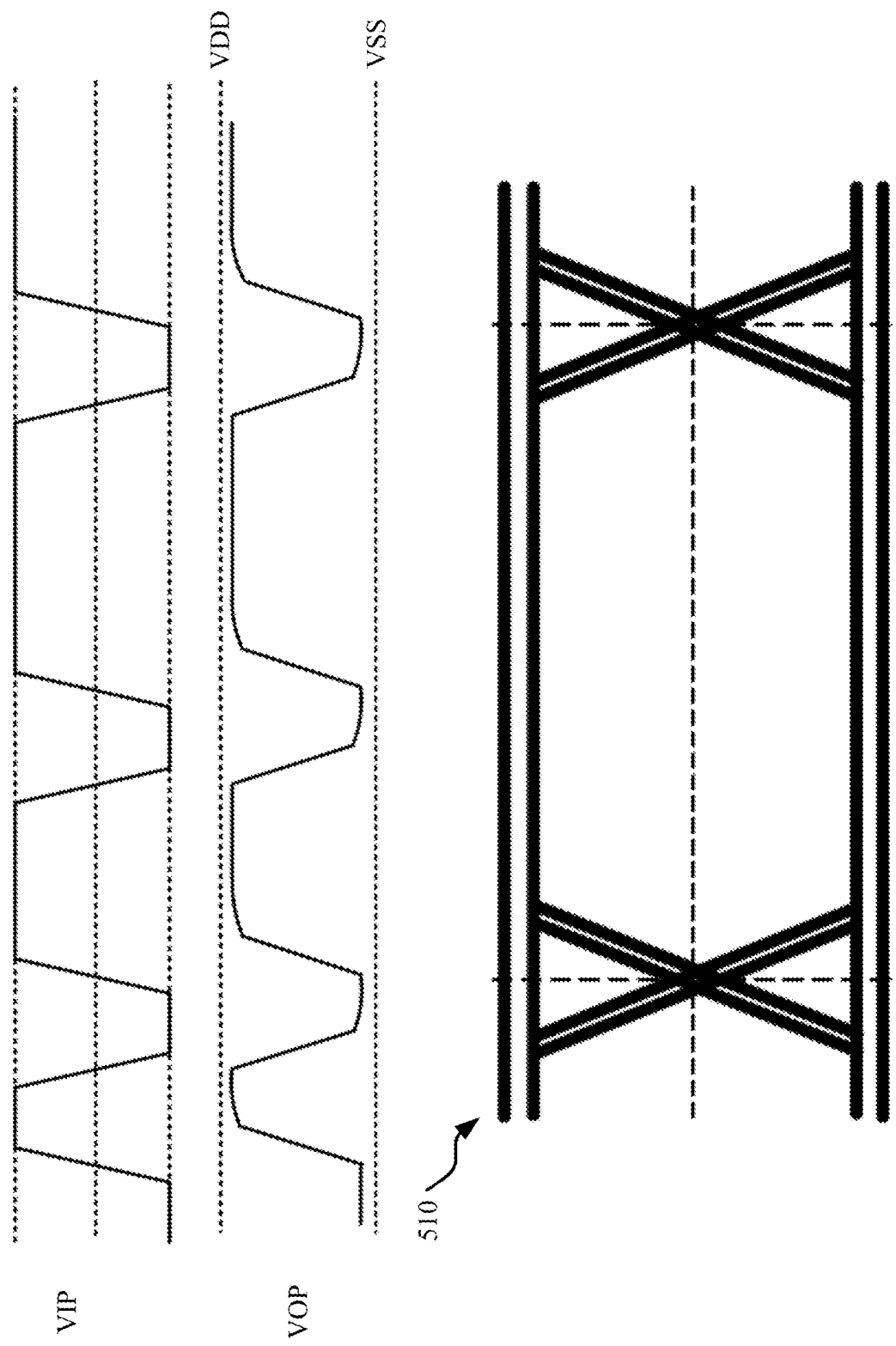
FIG. 5 is a waveform diagram and an eye diagram corresponding to comparator circuitry in FIG. 2 with the compensation circuit, according to some embodiments of the present disclosure.

In this example, the compensation circuit 130 is configured to be activated in response to the input signal VIN or the input signal VIP, in order to drain the compensation current ICP. For example, when the input signal VIP transits from the low level to the high level and the input signal VIN transits from the high level to the low level, the transistor MN3 is turned on and the transistor MN4 is turned off. Under this condition, the transistor MN3 drains the compensation current ICP from the second terminal of the transistor MP2 (i.e., the output terminal NOP) to the voltage source providing the voltage VSS. In some embodiments, when the input signal VIP transits from the low level to the high level and the input signal VIN transits from the high level to the low level, a level of the output signal VOP is slightly lower than the voltage VDD (as shown in FIG. 5 below).

Figure 3:
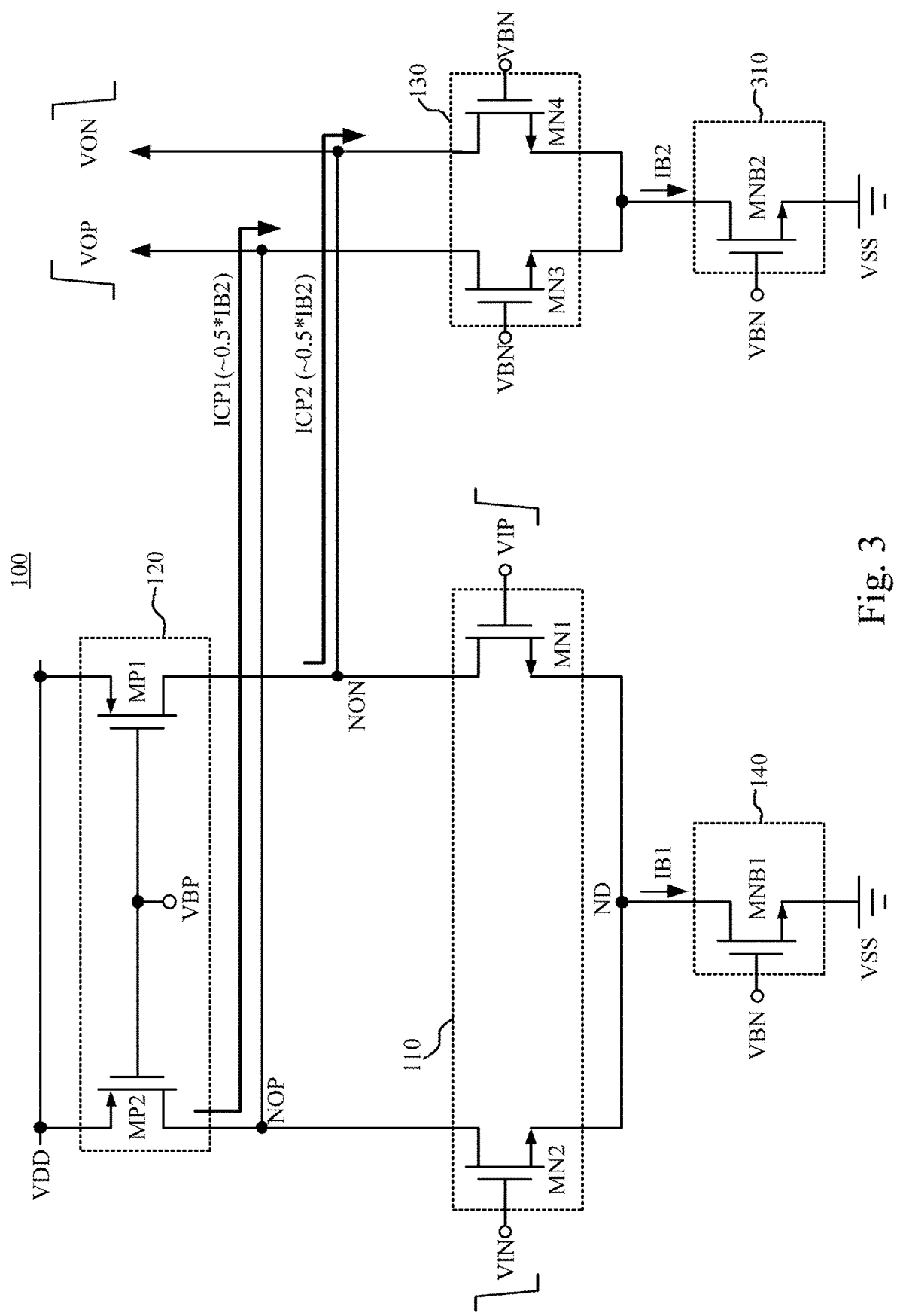
FIG. 3 is a circuit diagram of the comparator circuitry in FIG. 1, according to some embodiments of the present disclosure.

Reference is now made to FIG. 3. FIG. 3 is a circuit diagram of the comparator circuitry 100 in FIG. 1, according to some embodiments of the present disclosure. For ease of understanding, like elements in FIGS. 1-3 are designated with the same reference numbers.

Compared with FIG. 2, in this example, the comparator circuitry 100 further includes a current source circuit 310. The current source circuit 310 is coupled between the compensation circuit 130 and the voltage source providing the voltage VSS, and generates a bias current IB2 according to the bias signal VBN. Moreover, compared with FIG. 2, in this example, the compensation circuit 130 is coupled to the current source circuit 310, and is configured to be constantly turned on according to the bias signal VBN and the bias current IB2, in order to continuously drain a compensation current ICP1 and a compensation current ICP2 from the output terminals VON and VOP of the load circuit 120, respectively, to the voltage source providing the voltage VSS.

In greater detail, in some embodiments, the current source circuit 310 includes a transistor MNB2. A first terminal of the transistor MNB2 is coupled to second terminals of the transistor MN3 and the transistor MN4, a second terminal of the transistor MNB2 is coupled to the voltage source providing the voltage VSS, and a control terminal of the transistor MNB2 is configured to receive the bias signal VBN. The transistor MNB2 is configured to generate the bias current IB2 according to the bias signal VBN. In addition, in this example, the control terminals of the transistor MN3 and the transistor MN4 are configured to receive the bias signal VBN, in order to be constantly turned on to drain the compensation currents ICP1 and ICP2.

In this example, a sum of the compensation currents ICP1 and ICP2 that are constantly drained by the transistor MN3 and the transistor MN4 is substantially the same as the bias current IB2. In some embodiments, by setting sizes of components and/or biasing conditions, each of the compensation currents ICP1 and ICP2 is configured to be a half of the bias current IB2.

In some embodiments, each of the input pair circuit 110, the load circuit 120, and/or the compensation circuit 130 discussed above is configured to be a differential circuit. For ease of understanding, the above operations are given with reference to examples of compensating the output signal VOP. It is understood that, as the differential circuit is a symmetrical structure, the compensation circuit 130 is also able to perform the similar compensation to the output signal VON. For example, when the input signal VIP transits from the high level to the low level and the input signal VIN transits form the low level to the high level, the transistor MN4 is turned to drain a compensation current from the output terminal NON.

The above arrangements are given for illustrative purposes, and the present disclosure is not limited thereto. For example, in different embodiments, the transistors MNB2, MN3, and MN4 may be controlled by different bias signals.

The types (P type, N type) and the categories of the above transistors are given for illustrative purposes, and the present disclosure is not limited thereto. According to different operating voltages or applications, various types and various categories of the transistors can be employed to implement the comparator circuitry 100 of the present disclosure. Moreover, according to different types of the transistors, the level and the voltage in above embodiments are able to be adjusted correspondingly.

Figure 4:
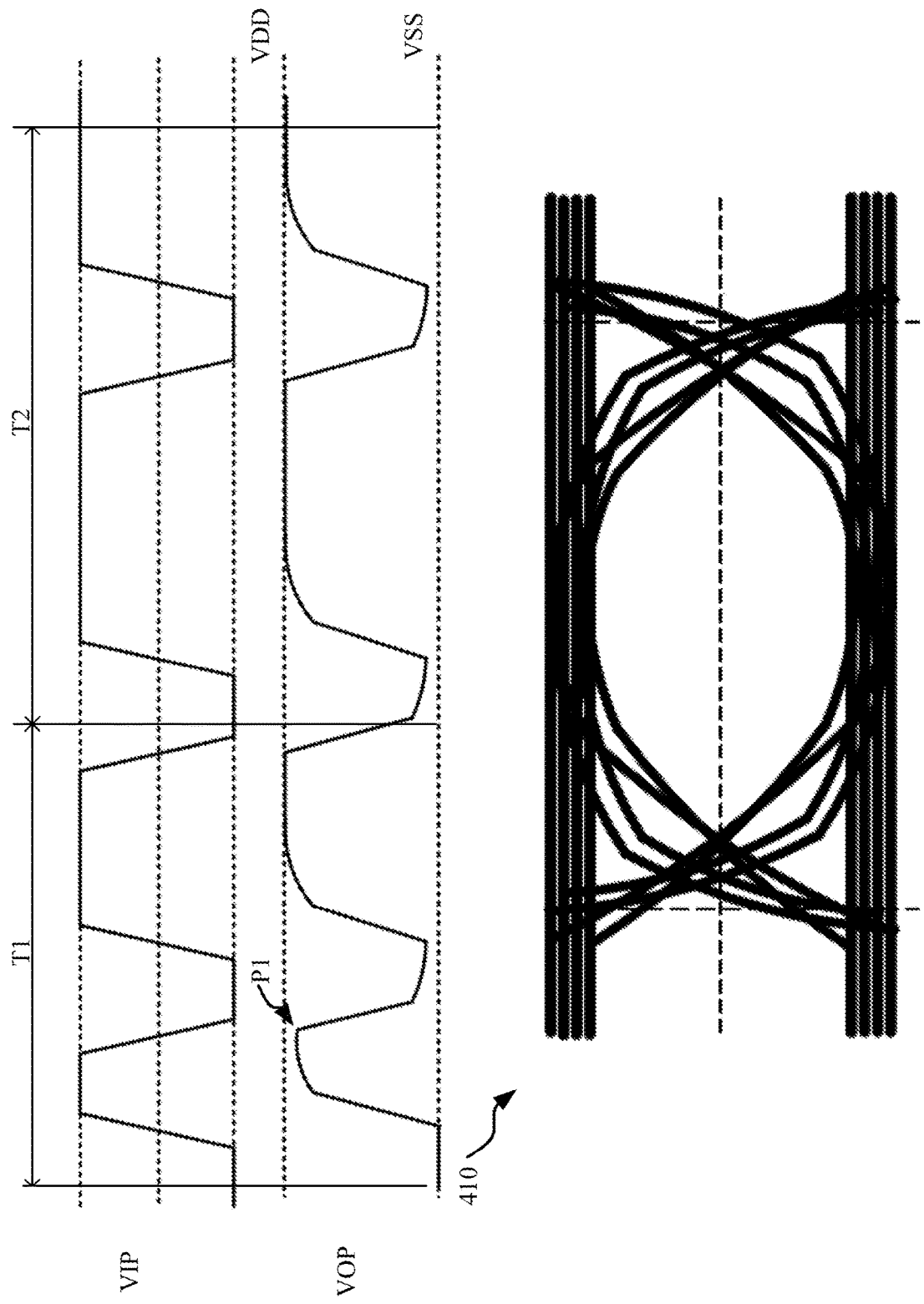
FIG. 4 is a waveform diagram and an eye diagram corresponding to some related approaches without using the compensation circuit.

Reference is now made to FIGS. 4 and 5. FIG. 4 is a waveform diagram and an eye diagram corresponding to some related approaches without using the compensation circuit 130. FIG. 5 is a waveform diagram and an eye diagram corresponding to comparator circuitry 100 in FIG. 2 with the compensation circuit 130, according to some embodiments of the present disclosure.

As described above, in some related approaches where the compensation circuit 130 is not employed, the output of the comparator is not able to rapidly reach a steady state, resulting in a lower signal quality. For example, as shown in FIG. 4, when the switching (transiting) frequency of the input signal VIP is faster (e.g., two transits in the time interval T1), the level of the output signal VOP is changed in response to a second transit of the input signal VIP before completely reaching the steady state to be stable at the level of the voltage VDD (i.e., pulse P1). Oppositely, in a subsequent interval T2 where the switching frequency is lower, the output signal VOP is able to enter the steady state to be stable at the level of the voltage VDD. In other words, in the related approaches without using the compensation circuit 130, the output signal VOP is dependent from the switching frequency of the input signal VIP. As a result, by measuring an eye diagram 410 of the output signal VOP, it is able to acquire that the output signal VOP is affected by more timing jitters, and thus has a lower signal quality.

Oppositely, as shown in FIG. 5, with the compensation circuit 130, whenever the input signal VIP transits, the output of the comparator circuitry 100 can enter the steady state rapidly. As a result, by measuring an eye diagram 510 of the output signal VOP, it is able to acquire that the output signal VOP is affected by less timing jitters. In other words, with the compensation circuit 130, the signal quality of the output signal VOP can be improved.

As described above, the comparator circuitry in embodiments of the present disclosure is able to improve the quality of the output signal by the compensation current, in order to be adapted to high-speed applications.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A comparator circuitry, comprising:
an input pair circuit configured to compare a first input signal with a second input signal, in order to control a first bias current;
a load circuit coupled to the input pair circuit, the load circuit configured to output an output signal having a first level from a first output terminal of the load circuit in response to the first bias current;
a compensation circuit coupled to the input pair circuit and the load circuit, the compensation circuit configured to drain a compensation current from the first output terminal to a voltage source during a period that the load circuit generates the output signal having a first level, wherein the voltage source is configured to provide a voltage having a second level; and
a first current source circuit coupled between the input pair circuit and the voltage source;
wherein during a duration that the input pair circuit compares the first input signal with the second input signal, the compensation current is drained from a signal path that conducts the least amount of the first bias current among signal paths in the load circuit;
wherein the compensation circuit is configured to be activated according to the first input signal, in order to drain the compensation current from the first output terminal, wherein the compensation current is transmitted to the voltage source via the first current source circuit;
wherein the compensation circuit and the input pair circuit are coupled to a node, the compensation current flows to the voltage source via the node, and the compensation circuit comprises:
a first transistor coupled between the first output terminal and the node, the first transistor configured to be turned on according to the first input signal, in order to drain the compensation current; and
a second transistor coupled between a second output terminal of the load circuit and the node, the second transistor configured to be turned on according to the second input signal.

2. The comparator circuitry of claim 1, wherein the first current source circuit is configured to generate the first bias current according to a bias signal.

3. The comparator circuitry of claim 1, wherein the load circuit comprises:
a plurality of transistors coupled to the input pair circuit, and coupled to the first output terminal and a second output terminal of the load circuit respectively.

4. A comparator circuitry, comprising:
a current source circuit configured to provide a bias current;
an input pair circuit coupled to the current source circuit, the input pair circuit configured to compare a first input signal with a second input signal, in order to steer the bias current;
a load circuit coupled to the current source circuit, the load circuit configured to generate a first output signal at a first output terminal and generate a second output signal at a second output terminal according to the steered bias current; and
a cross-coupled transistor pair, comprising:
a first transistor coupled between the first output terminal and the current source circuit; and
a second transistor coupled between the second output terminal and the current source circuit, wherein the first transistor and the second transistor are configured to be turned on according to the first input signal and the second signal, in order to drain a compensation current from corresponding one of the first output terminal and the second output terminal, wherein the compensation current is drained from a signal path that conducts the least amount of the bias current among signal paths in the load circuit.

* * * * *